United States Patent [19]

Mehendale

[11] Patent Number: 5,508,637
[45] Date of Patent: Apr. 16, 1996

[54] LOGIC MODULE FOR A FIELD PROGRAMMABLE GATE ARRAY

[75] Inventor: Mahesh M. Mehendale, Bangalore, Ind.

[73] Assignee: Texas Instruments Incorporated, Dallas, Tex.

[21] Appl. No.: 368,931

[22] Filed: Jan. 5, 1995

[51] Int. Cl.$^6$ ............................................. H03K 19/173
[52] U.S. Cl. ............................................. 326/38; 326/39
[58] Field of Search ............................. 326/38, 39, 41, 326/47, 37

[56] References Cited

U.S. PATENT DOCUMENTS

| | | | |
|---|---|---|---|
| 5,220,213 | 6/1993 | Chan et al. | 326/38 |
| 5,338,983 | 8/1994 | Agarwala | 326/39 |
| 5,436,574 | 7/1995 | Veenstra | 326/39 |
| 5,440,245 | 8/1995 | Galbraith | 326/38 |

OTHER PUBLICATIONS

Manisha Agarwala and Poras T. Balsara, "Application Specific Logic Module Architecture for FPGAs", IEEE 1992 Custom Integrated Circuits Conference, pp. 4.1.1–4.1.4.

*Primary Examiner*—Edward P. Westin
*Assistant Examiner*—Andrew Sanders
*Attorney, Agent, or Firm*—Peter T. Rutkowski; Richard L. Donaldson; William E. Hiller

[57] ABSTRACT

An 8-input, 1-output mux-based logic module for an FPGA is disclosed. The logic module comprises five separate multiplexers connected differently in the various embodiments of the present invention. The 8-input logic module can realize a total of 2390 unique functions. A 7-input, 1-output variation of the logic module of the preferred embodiment is also disclosed.

3 Claims, 2 Drawing Sheets

LOGIC MODULE FOR A FIELD PROGRAMMABLE GATE ARRAY

FIELD OF THE INVENTION

The present invention relates to a Field Programmable Gate Array (EPGA) logic module architecture and more particularly to a 7 or 8-input FPGA logic module architecture having enhanced functionality over prior art logic modules.

BACKGROUND OF THE INVENTION

In FIG. 1, there is shown a prior art FPGA architecture, such as the ACTEL-1010(manufactured by ACTEL Corporation of Sunnyvale, Calif.). This is an 8-input logic module 11 for performing combinational logic functions. The logic module 11 comprises first and second multiplexers 10, and 12, having 3 inputs each and one output each. The outputs of the multiplexers 10, and 12 are connected to two inputs of a third multiplexer 14. The seventh and eighth inputs to the logic module 11 are coupled to a select input of multiplexer 14 through an gate 16. In Fig., there is shown the prior art Actel-1280 FPGA. This logic module 13 is slightly different than the Actel-1010. The select inputs of the first and second multiplexers 10 and 12 are coupled together and the third and fourth inputs to the logic module 13 are coupled to these select inputs through an AND gate. For a more detailed description of the prior art FPGA logic modules, See "Application Specific Logic Module Architecture for FPGAs", IEEE 1992 Custom Integrated Circuits Conference, by M. Agarwala et al.

It is an object of the present invention to provide an FPGA logic module which provides the same number of inputs and comparable layout area as the prior art.

It is a further object of the present invention to provide an FPGA logic module having comparable timing performance while having increased functionality over the prior art.

These and other objects of the invention will become apparent to those of ordinary skill in the art having reference to the following specification, in conjunction with the drawings.

SUMMARY OF THE INVENTION

In one aspect of the present invention an 8-input, 1-output logic module for an FPGA comprises first, second, third, fourth, and fifth multiplexers. A first input to the logic module is connected to a first terminal of the first multiplexer and a second input to the logic module is connected to a second terminal of the first multiplexer and to a first terminal of the second multiplexer. A third input to the logic module is connected to a second terminal of the second multiplexer and a fourth input to the logic module is connected to select terminals of both the second and third multiplexers. A fifth input to the logic module is connected to a second terminal of the third multiplexer and a sixth input to the logic module is connected to a first terminal of the third multiplexer and to a second terminal of a fourth multiplexer. A seventh input to the logic module is connected to a first terminal of the fourth multiplexer and an eight input to the logic module is connected to a select terminal of the fourth multiplexer. An output terminal of the first multiplexer is connected to a first input terminal of the fifth multiplexer and a select terminal of the first multiplexer is connected to an output terminal of the third multiplexer. An output terminal of the second multiplexer is connected to a second input terminal of the fifth multiplexer and an output terminal of the fourth multiplexer is connected to a select terminal of the fifth multiplexer. And finally, an output of the logic module is connected to an output terminal of the fifth multiplexer.

The above logic module can realize a large number of functions compared to those realized by existing logic modules with the same number of inputs. In addition, comparable layout area and timing is achieved. The number of functions are 3.12 times the number of functions of the Actel-1280 and 3.4 times the number of functions of the Actel-1010.

DETAILED DESCRIPTION OF THE PREFERRED EMBODIMENT

Figure 3:
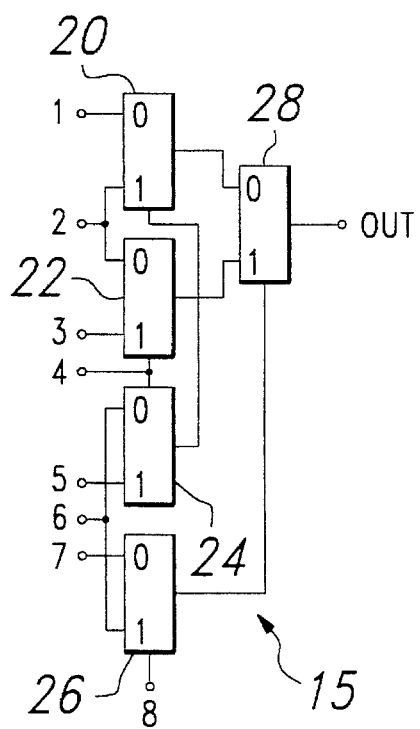
FIG. 3 is a schematic circuit diagram of a first preferred embodiment of an FPGA logic module.

The FPGA logic module of the preferred embodiment is shown in FIG. 3. The logic module 15 has 8 inputs and 1 output. The logic module 15 comprises first, second, third, fourth, and fifth multiplexers 20, 22, 24, 26 and 28. A first input to the logic module 15 is connected to a first terminal of the first multiplexer 20. A second input to the logic module 15 is connected to a second terminal of the first multiplexer 20 and to a first terminal of the second multiplexer 22. A third input is connected to a second terminal of the second multiplexer 22. A fourth input is connected to select terminals of both the second and third multiplexers 22, 24. A fifth input to the logic module 15 is connected to a second terminal of the third multiplexer 24 and a sixth input is connected to a first terminal of the third multiplexer 24 and to a second terminal of a fourth multiplexer 26. A seventh input to the logic module 15 is connected to a first terminal of the fourth multiplexer 26 and an eight input to the module is connected to a select terminal of the fourth multiplexer 26. An output terminal of the first multiplexer 20 is connected to a first input terminal of the fifth multiplexer 28 and a select terminal of the first multiplexer 20 is connected to an output terminal of the third multiplexer 24. An output terminal of the second multiplexer 22 is connected to a second input terminal of the fifth multiplexer 28 and an output terminal of the fourth multiplexer 26 is connected to a select terminal of the fifth multiplexer 28. And finally, the output of the logic module 15 is connected to an output terminal of the fifth multiplexer 28.

The above logic module 15 of FIG. 3 is for combinational macros, and it provides more functionality than the Actel-1010 and -1280 logic modules. The new logic module has 8 inputs(same as Actel-1010 and -1280) and the transistor count of this logic module circuit, is the same as the Actel-1280 logic module. In Table 1 below, the first column represents the number of inputs to the logic module that are used to implement a particular macro. The second column represents the number of unique macros that can be implemented by the logic module of the preferred embodiment illustrated in FIG. 1. In comparison, the third and fourth columns indicate the number of unique macros that can be implemented by the Actel-1280 and -1010 logic modules respectively.

TABLE 1

| No. of Inputs | No. of unique Macros | No. of Macros 1280 | No. of Macros 1010 |
| --- | --- | --- | --- |
| 1 | 2 | 2 | 2 |
| 2 | 8 | 8 | 8 |
| 3 | 58 | 48 | 47 |
| 4 | 529 | 238 | 210 |
| 5 | 1355 | 319 | 285 |
| 6 | 401 | 130 | 128 |
| 7 | 36 | 20 | 21 |
| 8 | 1 | 1 | 1 |
| Total | 2390 | 766 | 702 |

Figure 1:
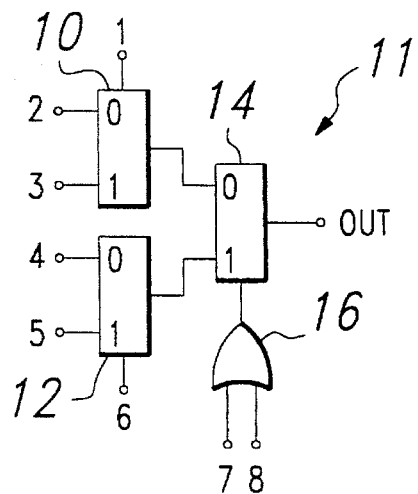
FIG. 1 is a schematic circuit diagram of a prior art FPGA logic module.
Figure 2:
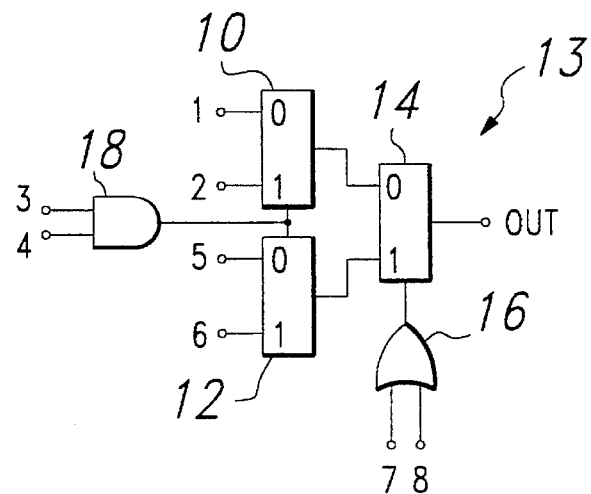
FIG. 2 is also a schematic circuit diagram of a prior art FPGA logic module.

As can be seen from Table 1 above, the total number of unique macro functions that can be implemented with the logic module of the preferred embodiment as shown in FIG. 1, is a factor of 3.12 greater than the Actel-1280 architecture and a factor of 3.4 greater than the Actel-1010 architecture. Thus, the new logic module of the present invention can provide much more functionality, with the same number of inputs, and comparable layout area, as compared to the Acetel-1280 and -1010 logic modules. Timing performance is also comparable. In terms of compatability, of the logic module of the present invention, with the Acetel-1280, the number of Acetel-1280 macros that can be realized by the new logic module of FIG. 1, is 2, 8, 48,198,112, 8, 0, 0 (total 376 macro functions) for 1, 2, 4, 5, 6, 7, and 8 inputs respectively. Thus, 49% of the Acetel-1280 macros can be implemented on the new logic module of FIG. 1 and 86% of the Acetel-1280 macros can be implemented on the new logic module if you consider only 1 through 4 input macros and exclude 5 through 8 input macros.

Alternate Embodiments

Figure 4:
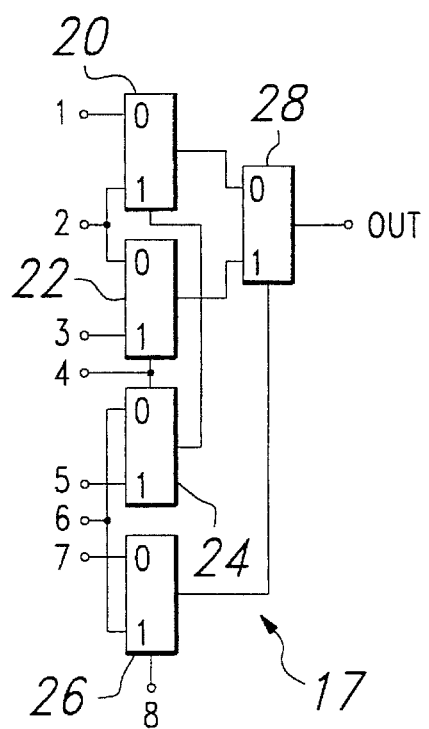
FIG. 4, is a schematic circuit diagram of a second embodiment of an FPGA logic module.

In FIG. 4, there is shown a schematic diagram for a second embodiment of an FPGA logic module. The logic module 17 has 8 inputs and 1 output. The logic module 17 comprises first, second, third, fourth, and fifth multiplexers 20, 22, 24, 26, and 28. A first input to the logic module 17 is connected to a first terminal of the first multiplexer 20. A second input to the logic module 17 is connected to a second terminal of said first multiplexer 20 and to a first terminal of the second logic module 17. A third input is connected to a second terminal of the second multiplexer 22. A fourth input is connected to select terminals of both the second and third multiplexers 22 and 24. A fifth input to the logic module is connected to a second terminal of the third multiplexer 24 and a sixth input is connected to a first terminal of the third multiplexer 24 and to a second terminal of a fourth multiplexer 26. A seventh input to the logic module 17 is connected to a first terminal of the fourth multiplexer 26 and an eight input to the logic module 17 is connected to a select terminal of the fourth multiplexer 26. An output terminal of the first multiplexer 20 is connected to a first input terminal of the fifth multiplexer 28 and a select terminal of the first multiplexer 20 is connected to an output terminal of the fourth multiplexer 26. An output terminal of the second multiplexer 22 is connected to a second input terminal of the fifth multiplexer 28 and an output terminal of the third multiplexer 24 is connected to a select terminal of the fifth multiplexer 28. And finally, the output of the logic module 17 is connected to an output terminal of the fifth multiplexer 28.

Figure 5:
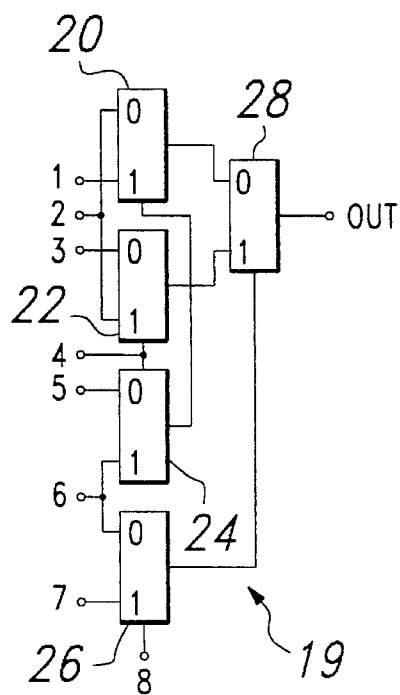
FIG. 5, is a schematic circuit diagram of a third embodiment of an FPGA logic module of the present invention.

In FIG. 5, there is shown a schematic diagram for a third embodiment of an FPGA logic module. The logic module 19 has 8 inputs and 1 output. The logic module 19 comprises first, second, third, fourth, and fifth multiplexers 20, 22, 24, 26, and 28. A first input to the logic module 19 is connected to a second terminal of the first multiplexer 20. A second input to the logic module 19 is connected to a first terminal of the first multiplexer 20 and to a second terminal of the second multiplexer 22. A third input to the logic module 19 is connected to a first terminal of the second multiplexer 22. A fourth input to the logic module 19 is connected to select terminals of both the second and third multiplexers 22 and 24. A fifth input to the multiplexer 19 is connected to a first terminal of the third multiplexer 24 and a sixth input is connected to a second terminal of the third multiplexer 24 and to a first terminal of the fourth multiplexer 26. A seventh input to the logic module 19 is connected to a second terminal of the fourth multiplexer 26 and an eight input to the logic module 19 is connected to a select terminal of the fourth multiplexer 26. An output terminal of the first multiplexer 20 is connected to a first input terminal of the fifth multiplexer 28 and a select terminal of the first multiplexer 20 is connected to an output terminal of the fourth multiplexer 26. An output terminal of the second multiplexer 22 is connected to a second input terminal of the fifth multiplexer 28 and an output terminal of the third multiplexer 24 is connected to a select terminal of the fifth multiplexer 28. And finally, the output of the logic module 19 is connected to an output terminal of the fifth multiplexer 28.

Figure 6:
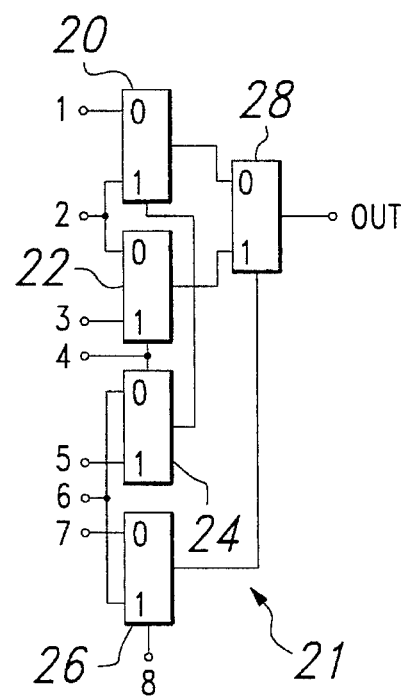
FIG. 6, is a schematic circuit diagram of a fourth embodiment of an FPGA logic module.

In FIG. 6, there is shown a schematic diagram for a fourth embodiment of an FPGA logic module. The logic module 21 has 8 inputs and 1 output. The logic module 21 comprises first, second, third, fourth, and fifth multiplexers 20, 22, 24, 26, and 28. A first input to the logic module 21 is connected to a second terminal of the first multiplexer 20. A second input to the logic module 21 is connected to a first terminal of the first multiplexer 20 and to a second terminal of the second multiplexer 22. A third input to the logic module 21 is connected to a first terminal of the second multiplexer 22. A fourth input to the logic module 21 is connected to select terminals of both the second and third multiplexers 22 and 24. A fifth input to the logic module 21 is connected to a first terminal of the third multiplexer 24 and a sixth input is connected to a second terminal of the third multiplexer 24 and to a first terminal of the fourth multiplexer 26. A seventh input to the logic module 21 is connected to a second terminal of the fourth multiplexer 26 and an eight input to the logic module 21 is connected to a select terminal of the fourth multiplexer 26. An output terminal of the first multiplexer 20 is connected to a first input terminal of the fifth multiplexer 28 and a select terminal of the first multiplexer 20 is connected to an output terminal of the third multiplexer 24. An output terminal of the second multiplexer 22 is connected to a second input terminal of the fifth multiplexer 28 and an output terminal of the fourth multiplexer 26 is connected tosd a select terminal of the fifth multiplexer 28. And finally, the output of the logic module 21 is connected to an output terminal of the fifth multiplexr.

Figure 7:
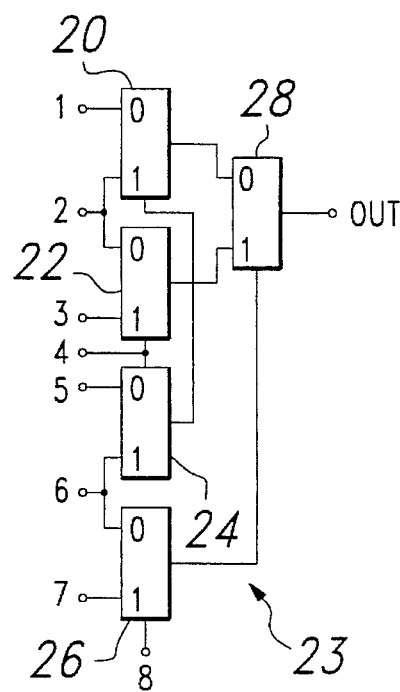
FIG. 7, is a schematic circuit diagram of a fifth embodiment of an FPGA logic module.

In FIG. 7, there is shown a schematic diagram for a fifth embodiment of an FPGA logic module. The logic module 23 has 8 inputs and 1 output. The logic module 23 comprises first, second, third, fourth, and fifth multiplexers 20, 22, 24, 26, and 28. A first input to the logic module 23 is connected to a first terminal of the first multiplexer 20. A second input to the logic module 23 is connected to a second terminal of the first multiplexer 20 and to a first terminal of the second multiplexer 22. A third input is connected to a second terminal of the second multiplexer 22. A fourth input to the logic module 23 is connected to select terminals of both the second and third multiplexers 22 and 24. A fifth input to the logic module 23 is connected to a first terminal of the third multiplexer 24 and a sixth input is connected to a second terminal of the third multiplexer 24 and to a first terminal of the fourth multiplexer 26. A seventh input to the logic module 23 is connected to a second terminal of the fourth multiplexer 26 and an eight input to the logic module 23 is connected to a select terminal of the fourth multiplexer 26. An output terminal of the first multiplexer 10 is connected to a first input terminal of the fifth multiplexer 28 and a select terminal of the first multiplexer 20 is connected to an output terminal of the third multiplexer 24. An output terminal of the second multiplexer 22 is connected to a second input terminal of the fifth multiplexer 26 and an output terminal of the fourth multiplexer 26 is connected to a select terminal of the fifth multiplexer 28. And finally, the output of the logic module 23 is connected to an output terminal of the fifth multiplexer 28.

Figure 8:
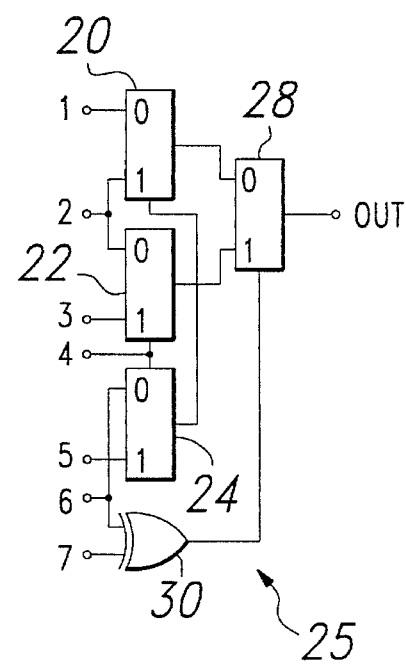
FIG. 8, is a schematic circuit diagram of a sixth embodiment of an FPGA logic module.

In FIG. 8, there is shown a schematic diagram for a fifth embodiment of an FPGA logic module. This logic module 25 has only 7 inputs and 1 output. The logic module 25 comprises first, second, third, and fourth multiplexers 20, 22, 24, 28 and an Exclusive-Or gate (XOR gate) 30. A first input to the logic module 25 is connected to a first terminal of the first multiplexer 20. A second input to the logic module 25 is connected to a second terminal of the first multiplexer 20 and to a first terminal of the second multiplexer 22. A third input is connected to a second terminal of the second multiplexer 22. A fourth input to the logic module 25 is connected to select terminals of both the second and third multiplexers 22 and 24. A fifth input to the logic module 25 is connected to a second terminal of the third multiplexer 24 and a sixth input is connected to a first terminal of the third multiplexer 24 and to a first terminal of the XOR gate 30. A seventh input to the logic module 25 is connected to the second terminal of the XOR gate 30. An output terminal of the first multiplexer 20 is connected to a first input terminal of the fourth multiplexer 28 and a select terminal of the first multiplexer 20 is connected to an output terminal of the third multiplexer 24. An output terminal of the second multiplexer 22 is connected to a second input terminal of the fourth multiplexer 28 and an output terminal of the XOR gate 30 is connected to a select terminal of the fourth multiplexer 28. And finally, the output of the logic module 25 is connected to an output terminal of the fourth multiplexer 28. Essentially, the only difference between the preferred embodiment of FIG. 1 and the 7-input logic module of FIG. 8 is that a multiplexer 26 is replaced by an XOR gate 30. This gives more functionality, for 1 through 4 inputs, than the Actel-1010 or -1280. The number of up to 4 input functions for the above described logic module of FIG. 8 is a total of 321—and the number of up to 4 input functions is a total of 267 and 296 for the Actel-1010 and Acetel-1280 logic modules respectively. Since up to 4 input functions are the most used macros, the above logic module can provide as good a logic packing, as the Actel-1010 and -1280 logic modules. However, the proposed logic module of FIG. 8 has 1 less input, which equates to a lower number of total antifuses, thus less capacitance—hence better performance and reliability.

In conclusion, these alternate embodiments of the all mux logic modules, as described above and illustrated in FIGS. 4–8 provide much more functionality than both the Actel-1010 and -1280 logic modules. The total number of functions in the logic modules of FIGS. 4–8 is however less than the logic module of the preferred embodiment described above and illustrated in FIG. 3. Tables 2–6 below correspond to the logic modules shown in FIGS. 4–8 respectively and show the number of unique macros that can be implemented by the different embodiments.

TABLE 2

| No. of Inputs | No. of unique Macros |
| --- | --- |
| 1 | 2 |
| 2 | 8 |
| 3 | 47 |
| 4 | 309 |
| 5 | 771 |
| 7 | 300 |
| 8 | 33 |
| 9 | 1 |
| Total | 1471 |

TABLE 3

| No. of Inputs | No. of Unique Macros |
| --- | --- |
| 1 | 2 |
| 2 | 8 |
| 3 | 48 |
| 4 | 322 |
| 5 | 831 |
| 6 | 321 |
| 7 | 24 |
| 8 | 1 |
| Total | 1557 |

TABLE 4

| No. of Inputs | No. of unique Macros |
| --- | --- |
| 1 | 2 |
| 2 | 8 |
| 3 | 53 |
| 4 | 433 |
| 5 | 1181 |
| 7 | 386 |
| 8 | 36 |
| 9 | 1 |
| Total | 2100 |

TABLE 5

| No. of Inputs | No. of Unique Macros |
| --- | --- |
| 1 | 2 |
| 2 | 8 |
| 3 | 55 |
| 4 | 512 |
| 5 | 1311 |

TABLE 5-continued

| No. of Inputs | No. of Unique Macros |
|---|---|
| 6 | 396 |
| 7 | 36 |
| 8 | 1 |
| Total | 2321 |

TABLE 6

| No. of Inputs | No. of unique Macros |
|---|---|
| 1 | 2 |
| 2 | 8 |
| 3 | 47 |
| 4 | 309 |
| 5 | 771 |
| 6 | 300 |
| 7 | 33 |
| 8 | 1 |
| Total | 1471 |

Although the invention has been described in detail herein with reference to its preferred embodiment, it is to be understood that this description is by way of example only, and understood that numerous changes in the details of the invention, will be apparent to, and may be made by persons of ordinary skill in the art having reference to this description. It is contemplated that such changes and additional embodiments are within the spirit and true scope of the invention as claimed below.

I claim:

1. An 8-input FPGA logic module comprises:

first, second, third, fourth, and fifth multiplexers;

a first input to the logic module is connected to a first terminal of the first multiplexer;

a second input to the logic module is connected to a second terminal of the first multiplexer and to a first terminal of the second multiplexer;

a third input to the logic module is connected to a second terminal of the second multiplexer;

a fourth input to the logic module is connected to select terminals of both the second and third multiplexers;

a fifth input to the logic module is connected to a second terminal of the third multiplexer;

a sixth input to the logic module is connected to a first terminal of the third multiplexer and to a second terminal of a fourth multiplexer;

a seventh input to the logic module is connected to a first terminal of the fourth multiplexer and an eighth input to the logic module is connected to a select terminal of the fourth multiplexer;

an output terminal of the first multiplexer is connected to a first input terminal of the fifth multiplexer and a select terminal of the first multiplexer is connected to an output terminal of the third multiplexer;

an output terminal of the second multiplexer is connected to a second input terminal of the fifth multiplexer and an output terminal of the fourth multiplexer is connected to a select terminal of the fifth multiplexer; and an output of the logic module is connected to an output terminal of the fifth multiplexer.

2. An 8-input FPGA logic module comprises:

first, second, third, fourth, and fifth multiplexers;

a first input to the logic module is connected to a first terminal of the first multiplexer;

a second input to the logic module is connected to a second terminal of said first multiplexer and to a first terminal of the second logic module;

a third input to the logic module is connected to a second terminal of the second multiplexer;

a fourth input to the logic module is connected to select terminals of both the second and third multiplexers;

a fifth input to the logic module is connected to a second terminal of the third multiplexer;

a sixth input to the logic module is connected to a first terminal of the third multiplexer and to a second terminal of a fourth multiplexer;

a seventh input to the logic module is connected to a first terminal of the fourth multiplexer and an eight input to the logic module is connected to a select terminal of the fourth multiplexer;

an output terminal of the first multiplexer is connected to a first input terminal of the fifth multiplexer and a select terminal of the first multiplexer is connected to an output terminal of the fourth multiplexer;

an output terminal of the second multiplexer is connected to a second input terminal of the fifth multiplexer;

an output terminal of the third multiplexer is connected to a select terminal of the fifth multiplexer; and an output of the logic module is connected to an output terminal of the fifth multiplexer.

3. A 7-input FPGA logic module comprises:

first, second, third, and fourth multiplexers;

an Exclusive-Or gate;

a first input to the logic module is connected to a first terminal of the first multiplexer;

a second input to the logic module is connected to a second terminal of the first multiplexer and to a first terminal of the second multiplexer;

a third input to the logic module is connected to a second terminal of the second multiplexer;

a fourth input to the logic module is connected to select terminals of both the second and third multiplexers;

a fifth input to the logic module is connected to a second terminal of the third multiplexer;

a sixth input to the logic module is connected to a first terminal of the third multiplexer and to a first terminal of the EXCLUSIVE-OR gate;

a seventh input to the logic module is connected to the second terminal of the EXCLUSIVE-OR gate;

an output terminal of the first multiplexer is connected to a first input terminal of the fourth multiplexer;

a select terminal of the first multiplexer is connected to an output terminal of the third multiplexer;

an output terminal of the second multiplexer is connected to a second input terminal of the fourth multiplexer;

an output terminal of the EXCLUSIVE-OR gate is connected to a select terminal of the fourth multiplexer; and an output of the logic module is connected to an output terminal of the fourth multiplexer.

* * * * *